(12) United States Patent
Belledent et al.

(10) Patent No.: US 8,889,550 B2
(45) Date of Patent: Nov. 18, 2014

(54) LITHOGRAPHIC METHOD FOR MAKING NETWORKS OF CONDUCTORS CONNECTED BY VIAS

(75) Inventors: Jerome Belledent, Crolles (FR); Laurent Pain, St Nicolas de Macherin (FR); Sebastien Barnola, Villard-Bonnot (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 4 days.

(21) Appl. No.: 13/701,011

(22) PCT Filed: May 25, 2011

(86) PCT No.: PCT/EP2011/058600
§ 371 (c)(1),
(2), (4) Date: Nov. 29, 2012

(87) PCT Pub. No.: WO2011/151244
PCT Pub. Date: Dec. 8, 2011

(65) Prior Publication Data
US 2013/0072017 A1    Mar. 21, 2013

(30) Foreign Application Priority Data
Jun. 1, 2010    (FR) ....................................... 10 02307
May 25, 2011    (of) .......................... PCT/EP11/58600

(51) Int. Cl.
H01L 21/44    (2006.01)
H01L 21/033    (2006.01)
H01L 21/768    (2006.01)

(52) U.S. Cl.
CPC ...... *H01L 21/76816* (2013.01); *H01L 21/0337* (2013.01); *H01L 21/76813* (2013.01); *H01L 21/76811* (2013.01)
USPC .................................. 438/672; 257/E21.585

(58) Field of Classification Search
CPC .............. H01L 21/768; H01L 21/0337; H01L 21/76816; H01L 21/76813; H01L 21/76807
USPC .................................. 438/672; 257/E21.585
See application file for complete search history.

(56) References Cited

U.S. PATENT DOCUMENTS 7,470,616 B1 *    12/2008    Akinmade-Yusuff et al. ............................. 438/637
2002/0110987 A1 *    8/2002    Juengling ..................... 438/296

(Continued)

FOREIGN PATENT DOCUMENTS

WO        2008/033695 A2    3/2008

*Primary Examiner* — Caleb Henry
(74) *Attorney, Agent, or Firm* — Baker & Hostetler LLP

(57) ABSTRACT

A method of lithography for formation of two networks of conductors connected by vias in microelectronic integrated circuits comprises, after formation of a first network of buried conductors under an insulating layer: deposition and etching of a sacrificial layer on a substrate, formation of spacers along all edges of elements of the sacrificial layer; removal of this layer; etching of a masking layer. Then, two successive etchings of the insulating layer are carried out, over two successive depths, one defining the depth of the conductors of the second network, the other defining a complement of depth needed at the desired locations for the vias. One of the etchings is defined by the masking layer and corresponds to the locations of the conductors of the second network; the other is defined both by the spacers and by openings in a layer etched by lithography and corresponds to the locations of the vias. Lastly, following the two etchings, the regions etched into the insulating material of the substrate are filled with a conductive material which forms the conductors and the vias at the same time.

10 Claims, 5 Drawing Sheets

(56) References Cited

U.S. PATENT DOCUMENTS

| | | | |
|---|---|---|---|
| 2005/0032343 A1* | 2/2005 | Wu et al. | 438/597 |
| 2005/0142861 A1* | 6/2005 | Yeom | 438/639 |
| 2006/0046201 A1 | 3/2006 | Sandhu et al. | |
| 2006/0046422 A1 | 3/2006 | Tran et al. | |
| 2006/0240361 A1 | 10/2006 | Lee et al. | |
| 2008/0128912 A1* | 6/2008 | Streck et al. | 257/762 |
| 2008/0174019 A1* | 7/2008 | Ryu | 257/751 |
| 2008/0182408 A1* | 7/2008 | Lee et al. | 438/675 |
| 2009/0173929 A1* | 7/2009 | Gidon | 257/3 |
| 2010/0227470 A1* | 9/2010 | Nagano | 438/627 |
| 2010/0244257 A1* | 9/2010 | Matsuno et al. | 257/751 |
| 2011/0053369 A1* | 3/2011 | Jang et al. | 438/652 |
| 2011/0241167 A1* | 10/2011 | Feustel et al. | 257/532 |
| 2011/0272812 A1* | 11/2011 | Horak et al. | 257/758 |
| 2013/0175583 A1* | 7/2013 | Yuan et al. | 257/288 |

* cited by examiner

LITHOGRAPHIC METHOD FOR MAKING NETWORKS OF CONDUCTORS CONNECTED BY VIAS

CROSS-REFERENCE TO RELATED APPLICATIONS

This application is a National Stage of International patent application PCT/EP2011/058600, filed on May 25, 2011, which claims priority to foreign French patent application No. FR 1002307, filed on Jun. 1, 2010, the disclosures of which are incorporated by reference in their entirety.

FIELD OF THE INVENTION

The invention relates to lithography for the etching of very dense patterns on a substrate, and more precisely for the fabrication of networks of conductors in microelectronic integrated circuits.

BACKGROUND

Dense patterns are understood to mean patterns, some elements of which are very narrow and separated by intervals that are very narrow. With photolithography, a sensitive layer is exposed, for example through a mask, for example to an ultraviolet beam, typically to a wavelength of 193 nanometers. The density of the patterns, in other words the resolution that can be achieved in the etching of the pattern, is linked to several parameters but it firstly depends on the wavelength used; the shorter it is the higher the density. The density of the patterns can be increased by using extreme ultraviolet (notably at 13.5 nanometers); it can also be increased by using an exposure to an electron beam of very small diameter, but the process of etching is much slower because the writing of a pattern is carried out point by point and not through a global mask defining the patterns; furthermore, narrow electron beams can generate phenomena of dispersion and back-scattering of electrons to the detriment of the resolution.

In the field of memories, in order to increase the possible density of the lines needed in order to fabricate these memories, a known solution is to carry out the following steps:
  formation of a sacrificial layer on a substrate,
  etching of the sacrificial layer according to first strips,
  formation of spacers along all the edges of the sacrificial layer thus etched;
  removal of the sacrificial layer so as to leave only the spacers remaining forming the dense lines sought.

The invention provides an improvement of this type of method, suited to the fabrication of superposed networks of conductors, separated by an insulating layer and connected by conducting vias through this insulating layer.

A problem is then posed which is the alignment of the vias with respect to at least one of the two conducting networks and the invention provides a solution using common steps for the formation of the second conducting network and of the vias, and, for the vias, using an alignment by spacers which are used to define conductors—, in such a manner that the vias are perfectly aligned with the second network even when the latter is very dense.

SUMMARY OF THE INVENTION

According to the invention, steps for formation of spacers are carried out starting from a sacrificial layer on a substrate which already comprises a first network of conductors covered by an insulating material and by a mineral layer (hard mask) and the mineral layer is etched according to the pattern of free regions defined by the spacers; this pattern is that of the conductors of the second network. Then, two successive etchings are carried out of the insulating material of the substrate, over two successive depths, one defining the depth of the conductors of the second network, the other defining a complement of depth required at the desired locations for the vias. One of the etchings is defined by the hard mask and it corresponds to the locations of the conductors of the second network; the other is defined both by openings in a lithography photoresist and by the same spacers that have been used to etch the hard mask, and it corresponds to the locations of the vias. The order of the etches is not important. Lastly, after the two etchings, the etched regions in the insulating material of the substrate are filled with a conductive material which forms the conductors and the vias at the same time.

In summary, the invention provides a lithographic method for forming in a substrate two superposed networks of conductors separated by an insulating layer, with conducting vias in the insulating layer for connecting conductors of the first network to the conductors of the second network at locations where these conductors cross one another, the method comprising:
  the formation of the conductors of the first network on the substrate,
  the deposition of an insulating material covering the conductors of the first network,
  the deposition of a mineral mask layer onto the insulating material,
  the deposition of a sacrificial layer and the etching of this layer according to a first partial pattern,
  the formation of spacers on the edges of the elements of the sacrificial layer thus etched, the spacers leaving free regions defining a second partial pattern,
  the elimination of the sacrificial layer so as to leave only the spacers remaining,
  the etching of the mineral mask layer protected by the spacers, this etching defining the locations of the conductors of the second network,
  a first etching of the insulating material down to a first depth,
  a second etching of the insulating material down to a second depth,
  one of the etchings being defined by the configuration of the mineral mask and corresponding to the locations of the conductors of the second network, and the other etching being bounded both by openings formed in a layer etched by lithography and by the second partial pattern defined by the spacers, the openings defining the locations of conducting vias and being bounded on at least two opposing edges by spacers,
  finally, the filling of the regions etched into the insulating material by a conductive material flush with the surface of the material without overspilling from the regions etched away, this material forming both the conductors of the second network and the conducting vias.

The insulating material is preferably a dielectric material with a low dielectric constant deposited on a silicon wafer; the conductive material is preferably copper and is flush with the surface of the insulating material without overspilling from the regions etched away.

The etching bounded by means of the layer of photoresist is preferably an etching by electron beam, and the layer of photoresist preferably has a thickness less than the height of the spacers.

Between the step for elimination of the sacrificial layer and the etching of the mineral mask layer, an additional of lithography step, preferably by electron beam, is preferably provided in order to protect additional regions other than the locations of the spacers from being etched. The sensitive layer used during this lithography step preferably has a thickness less than or equal to the height of the spacers.

BRIEF DESCRIPTION OF THE DRAWINGS

Other features and advantages of the invention will become apparent upon reading the detailed description that follows and which is presented with reference to the appended drawings in which.

DETAILED DESCRIPTION

The invention will be described with regard to the formation of a structure referred to as "dual damascene" comprising a first network of conductors buried in an insulating substrate and a second network of conductors superposed on the first and connected to the latter through conducting vias opened in the substrate, the two networks being designed according to dense patterns.

Figure 1:
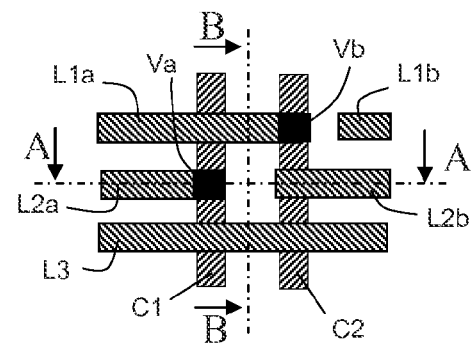
FIG. 1 shows one schematic example of a dual network of conductors that it is desired to form on a substrate, with vias between the conductors of the two networks.
Figure 2:
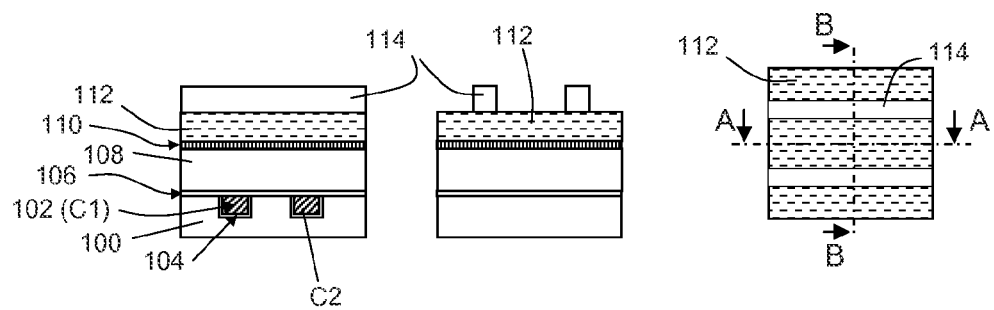
FIGS. 2 to 8 show the first steps in the implementation of the invention.
Figure 3:
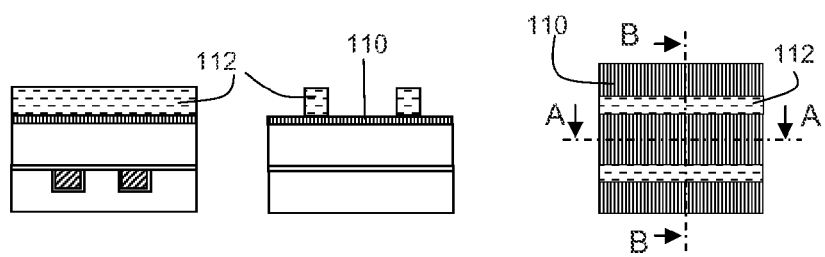

FIG. 1 shows the desired structure as a top view; a lower network comprises conductors as vertical strips; an upper network comprises conductors as horizontal strips; two contact vias are shown at the crossing points between a vertical conductor and a horizontal conductor; the other crossing points are crossing points with no contact.

The first (lower) network comprises, in this example, two conductors C1 and C2 oriented vertically in the drawing; the second, upper, network comprises three parallel lines of conductors oriented horizontally in the drawing; two of the lines are interrupted at one place, in other words each divided into two sections separated by an interval; the sections are L1a, L1b for the first line, L2a, L2b for the second line. The third line L3 is continuous. The horizontal and vertical conductors cross one another and two vias for electrical connection Va and Vb are provided at the crossing point of the section L1a and of the conductor C2 and at the crossing point of the section L2a and of the conductor C1, respectively. The other crossing points are crossing points without connection vias. The spacings between conductors or between sections can be as small as 20 to 30 nanometers.

The first network of conductors may have been made by any given method and it is essentially the fabrication of the second network and of the connection vias that will be described. This fabrication is described with reference to FIGS. 2 to 15 which illustrate the various steps of the method. In each figure, three drawing elements are shown which are, respectively: on the right, a top view of the structure; on the left, a cross section of the structure along the line AA in the top view, and in the center, a cross section along the line BB in the top view. In order to make the figures more readable, on the cross-sectional drawings, only the elements situated in the cross-sectional plane are shown, and the buried conductors of the first network (which are visible in FIG. 1) are not shown in the top views.

It is therefore considered (FIG. 2) that the starting point is a substrate 100, for example made of silicon, in which buried conductors 102 have been formed, for example copper conductors buried in trenches whose sidewalls are insulated by tantalum nitride 104. These conductors form the first network. The substrate and its buried conductors are covered by an insulating layer or dielectric layer 108 which provides the insulation between the two networks of conductors; an insulating adaptation layer 106 may be provided between the substrate 100 and the dielectric layer 108. Vias will be formed through the dielectric layer 108 (and the layer 106) at the places where a conductor of the second network crosses over a conductor of the first network and has to be connected to the latter. The dielectric layer is preferably a layer with a low dielectric constant (low-k dielectric), such as silicon oxide doped with carbon or fluorine.

The dielectric layer is covered by a surface layer 110 forming a mask for etching of the second network of conductors and the conducting vias. The etching mask is a mineral mask (as opposed to photoresist masks which are masks made of organic material); it can be a titanium nitride mask.

A sacrificial layer 112, which can be a layer of carbon deposited by a spin-on process (spin-on carbon), covers the nitride layer 110. It will be removed at a later stage.

A layer of photoresist 114 sensitive to ultraviolet radiation is deposited and is etched by ultraviolet photolithography so as to define a first pattern of photoresist; this pattern is a first partial pattern being used for the definition of the second network of conductors. Once developed, the photoresist defines the locations for protection of the sacrificial layer. An intermediate antireflective layer, not shown, facilitating the photolithography, can be interposed between the sacrificial layer 112 and the photoresist layer 114.

The sacrificial layer is etched away at the places where it is not protected by the photoresist and the photoresist is removed (FIG. 3); this results in a structure comprising the first partial pattern of free regions not covered by elements of the sacrificial layer 112.

Figure 4:
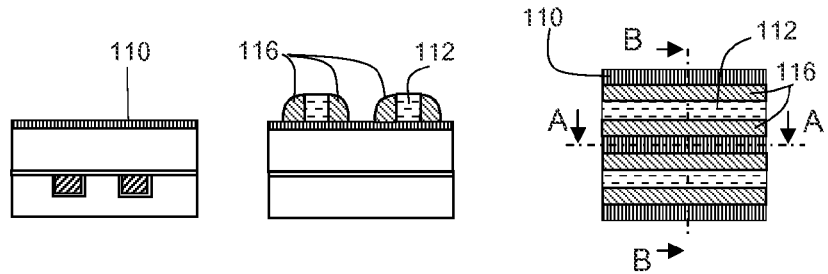

The spacers 116 are then formed along the edges of the sections of the sacrificial layer (FIG. 4). The spacers can be made of silicon oxide or silicon nitride or a silicon oxynitride SiOxNy, or else an organic material. The spacers may be formed by a conformal deposition of a layer, followed by a vertical anisotropic etching over a limited thickness, exposing the upper surface of the sacrificial layer and at the same time exposing the layer 110, but leaving portions remaining along all the sidewalls of the elements of the sacrificial layer. These portions remain by virtue of the excess layer thickness which accumulates along these sidewalls during the conformal deposition; these constitute the spacers 116.

The regions not covered by the spacers and the sacrificial layer define a second partial pattern, deduced directly from the first since there has not been any other photolithographic operation after the definition of the first partial pattern.

Figure 5:
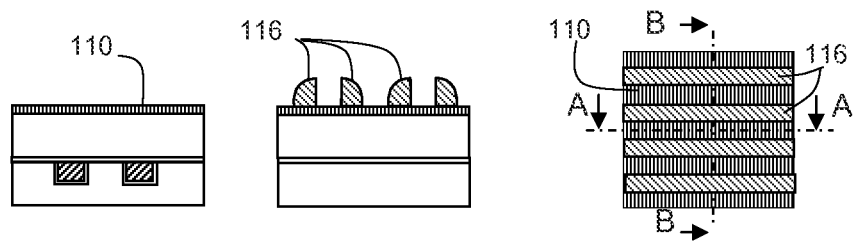
Figure 6:
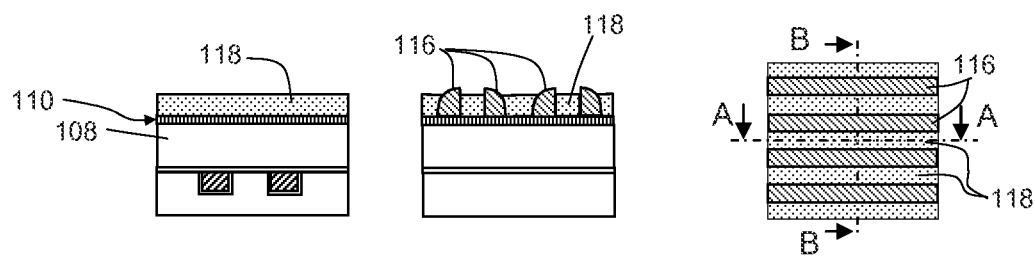

At this stage, the sacrificial layer 112 is eliminated, leaving only the spacers 116 remaining (FIG. 5). The pattern of free regions is then a combination of the first and the second partial patterns.

A layer 118 is then deposited (FIG. 6) which, advantageously, is a layer sensitive to a photon or ion or electron beam, to a thickness less than the height of the spacers (which is itself the height of the sacrificial layer which has now disappeared). If a full-sheet etching of the sensitive layer 118 needs to be carried out in order to reduce its height until it no longer exceeds that of the spacers, this etching is done at this stage.

Figure 7:
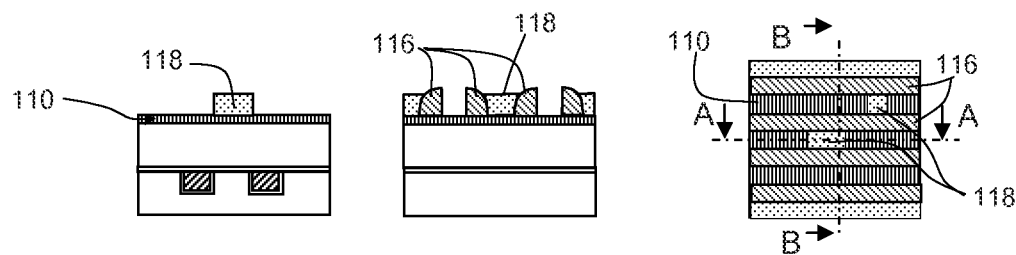
Figure 8:
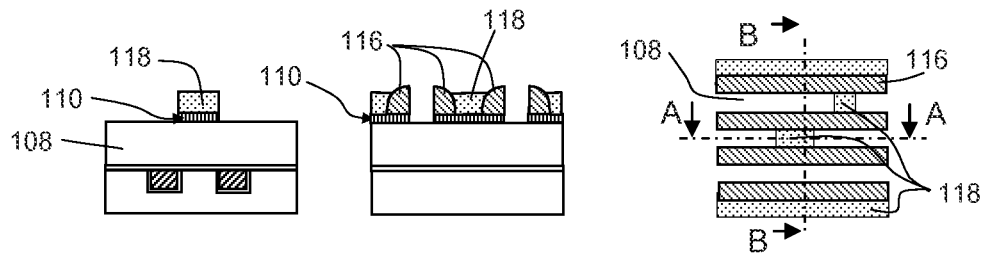

The etching of the layer 118 by a suitable type of radiation is subsequently carried out. The developed sensitive layer defines a third partial pattern (FIG. 7). This lithographic operation is used to complete the definition of the pattern of conductors of the second network, and more precisely here, the definition of the interruptions between the sections of lines, L1a, L1b for example: the interruptions are masked by the sensitive layer 118.

As a variant, the layer 118 could be composed of a non-sensitive lower layer, with a thickness less than the height of the spacers, covered by a layer sensitive to a type of radiation. The sensitive layer defines a pattern in the non-sensitive layer and the non-sensitive layer can then be used as a lithography mask for the nitride layer 110.

Advantageously, the sensitive layer is etched by an electron beam.

If the etching of the sensitive layer is done by optical radiation, ultraviolet for example, then the optical index of the layer which is situated between the spacers is preferably substantially equal to that of the spacers (typically with difference of less than 1%).

After this operation, a final pattern of free regions subsists on the substrate which are not masked either by the spacers or by the sensitive layer 118; this pattern is a combination of the first, second and third partial patterns. It constitutes the pattern of conductors of the second network, including the locations of conducting vias.

Figure 9:
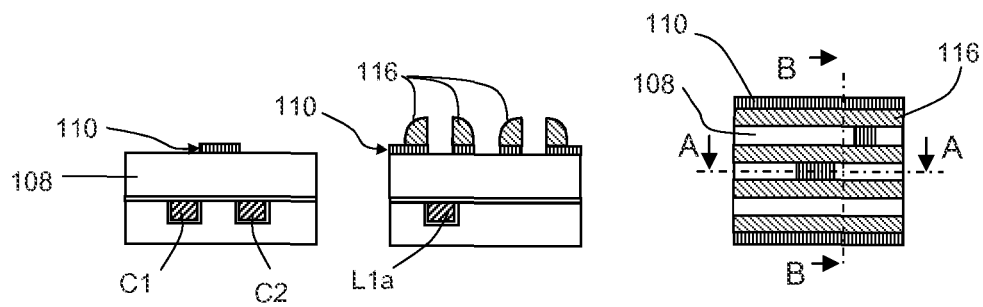
FIGS. 9 to 15 show the following steps of the method in a first variant.
Figure 10:
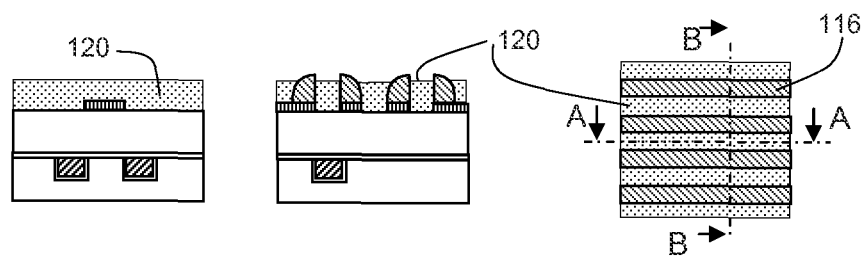

The etching mask layer 110 is then etched at the places where it is not covered either by the sensitive layer or by the spacers, so as to transfer the final pattern onto it (FIG. 8); the mask then corresponds to the pattern of conductors of the second network. Finally, the sensitive layer 118 is removed (FIG. 9).

It will be noted that, in FIGS. 9 to 19, the vertical cross-sectional line R-R is not situated at the same place as in the preceding figures: it now passes through the via Va situated at the top-right in FIG. 1 (the vias are not yet defined at this stage).

In order to define the vias, a new layer advantageously sensitive to photon or ion or electron radiation will be used, and here again the thickness of this layer is lower than the height of the spacers 116. The layer, that will be referred to as "sensitive layer" for simplicity, may, as previously, be composed either of a single sensitive layer or of a superposition of two layers: a lower non-sensitive layer, with a thickness less than the height of the spacers, covered by an upper layer sensitive to a type of radiation; in this case, the upper sensitive layer is used to define a pattern in the non-sensitive layer and the non-sensitive layer can be used as an etching mask for the vias.

After exposure of the sensitive layer to the beam of radiation and after development, the parts of the single sensitive layer, or of the lower non-sensitive layer, which subsist mask the desired regions. The entirety of this layer defined by lithography and of the spacers previously formed defines the desired pattern of vias.

It is possible to deposit this single or dual sensitive layer either immediately after having removed the layer 118 or after having performed a prior etching of the substrate over a part of its depth. The case where the new sensitive layer is deposited immediately will firstly be described in detail, and subsequently, the possibility of only depositing it at a later stage will be described. It will be assumed for simplicity that the sensitive layer is a single layer.

A new sensitive layer 120 is therefore deposited (FIG. 10) to a thickness less than the height of the spacers.

Advantageously, here again a photoresist sensitive to an electron beam is used as sensitive layer 120.

In the case of photoresists sensitive to photon radiation, for the photolithography of the layer situated between the spacers (one dimension of which is less than the wavelength), materials with indices substantially equal (typically with a difference of less than 1%) will preferably be chosen for the spacers and the layer deposited between the spacers.

Openings 122 are opened up in the sensitive layer according to a pattern which is used to bound the conducting vias to be formed (FIG. 11); the openings 122 are formed at the location of crossing points of conductors of the two networks, at the places where contacts need to be established between two conductors that cross one another. The etching of the sensitive layer is carried out by an electron beam. Its resolution is improved owing to the height of the sensitive layer being lower than the height of the spacers, and this will be even better in the case where the spacers are made of relatively heavy materials capable of better absorbing the electrons dispersed laterally during the exposure to the electron beam.

Figure 11:
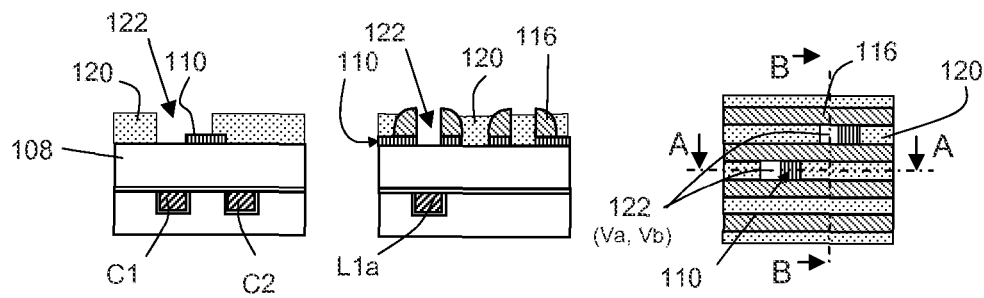

The pattern of etching of the openings 122 in the sensitive layer can overspill in part over regions of the etching mask 110 (see in the left part of FIG. 11); in this case, it is the etching mask that will define the edge of the vias; at other locations (see again the left part of FIG. 11), the edge of the sensitive layer rests directly on the dielectric layer 108 and, in this case, it is the sensitive layer that defines the edge of the via; finally, at yet other places and on at least two edges of the vias, the edge of the sensitive layer stops on spacers and, in this case, it is the spacers that define the edges of the vias (see in the central part of FIG. 11 the via above a conductor of the first network).

Figure 12:
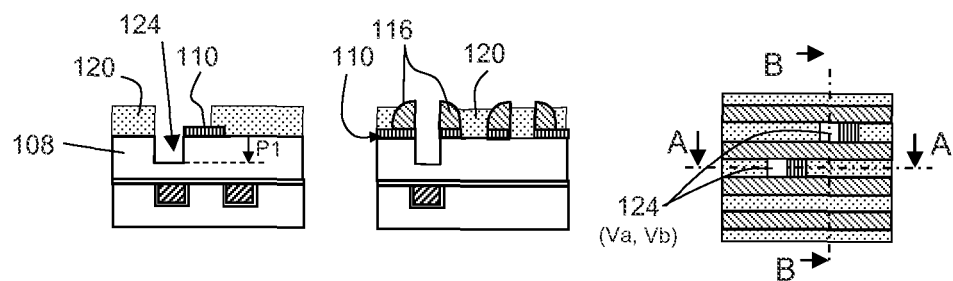
Figure 13:
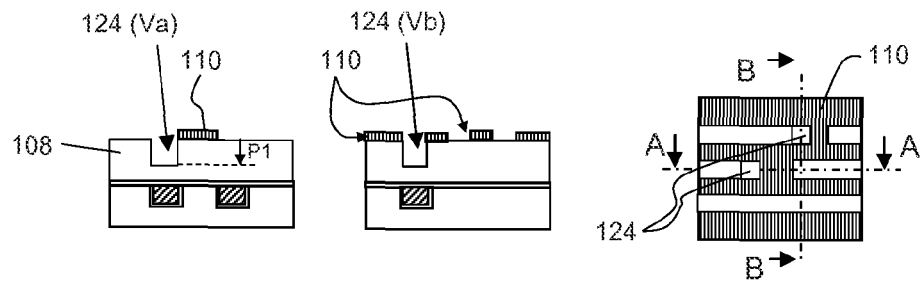
Figure 14:
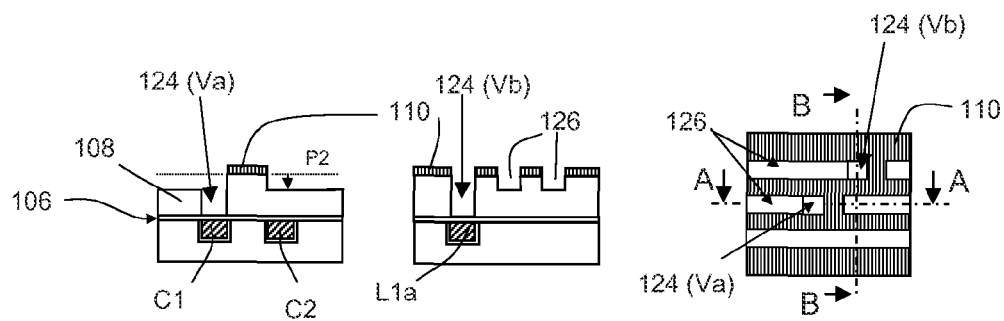

Vias 124 are then etched into the dielectric layer 108 to a first depth P1, less than the thickness of the layer 108, at the locations where the dielectric layer is not protected either by the nitride mask 110 or by the sensitive layer 120 (FIG. 12). Then, the sensitive layer and the spacers (FIG. 13) are removed.

The etching of the dielectric layer is continued down to a second depth P2 (FIG. 14); the etching is this time defined only by the nitride mask 110 which exactly corresponds to the pattern of conductors of the second network; the depth P2 corresponds to the desired thickness for the conductors of the second network; in the places where there are vias 124, the etching combines the two depths P1 and P2 and the sum of the depths is such that the vias reach the first network of conductors; the depth P1 is therefore the complement of etching depth needed to reach the conductors of the first network.

Figure 15:
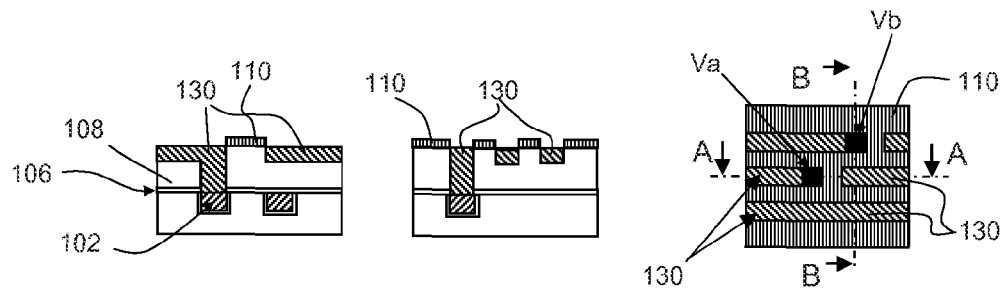

If an adaptation layer 106 is provided in the structure, it is eliminated in the bottom of the vias at this stage so as to expose the conductors of the first network at the bottom of the vias. Conducting metal 130 is then deposited in the openings etched in the layer 108, including at the bottom of the vias. This metal forms the second conductor network together with the vias between the two networks (FIG. 15).

The conducting metal can be copper, which is later on made flush so as not to overspill from these etched-out locations. The deposition of copper according to this damascene method can comprise steps such as an initial deposition of tantalum nitride at the bottom of the openings etched into the layer 108. These steps are not detailed.

The nitride mask is removed at the end of processing.

The structure of dual network of conductors at this stage is indeed the desired structure which is shown in FIG. 1.

As has been said hereinabove, the order of the etchings of the dielectric layer 108 can be reversed and the first etching step carried out prior to the deposition of the new layer 120 sensitive to the electron beam. Overall, this amounts to executing the step in FIG. 14 before the steps in FIGS. 10 to 12. The order of etching down to the depths P1 and P2 is therefore reversed: P2 becomes the first depth etched out for forming the conductors, P1 becomes the second depth etched out for forming the vias.

Consequently, after the etching of the mineral mask 110 (FIG. 8), the insulating material is etched off the substrate in the areas which are not covered by the mineral mask, down to a first depth (which is denoted P2: this is the depth necessary for forming the conductors of the second network); then, the new layer 120 sensitive to an electron beam is deposited to a thickness less than or equal to the height of the spacers, this sensitive layer is etched by means of an electron beam, the insulating material of the substrate is etched down to a second depth (which can be denoted P1) at the places where it is not covered by the sensitive layer or the mask, the sensitive layer and the spacers are eliminated, and finally, the locations etched into the insulating material are filled with a conducting metal.

The sum of the depths P1+P2 is the depth of the first network of conductors.

The locations etched into the insulating material of the substrate are filled with conducting metal, and amongst these locations, those which are only etched down to the first depth (P2) form a second network of conductors, and those which are etched down to the sum of the first (P2) and the second depth (P1) form connection vias between the first network and the second network.

Consequently, after the step in FIG. 9, in this case the succession of steps in FIGS. 16 to 19 is carried out which replaces the succession of steps in FIGS. 10 to 14 of the previous embodiment.

Figure 16:
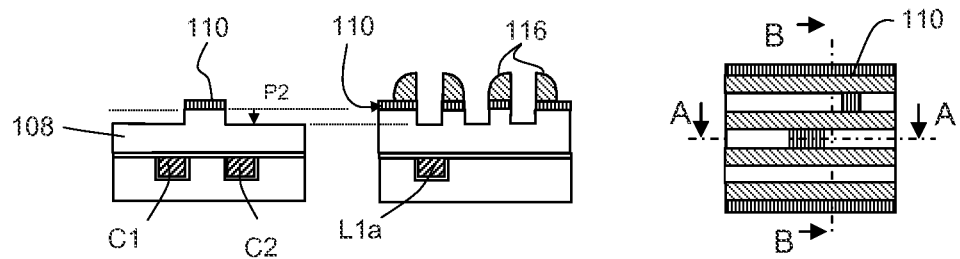
FIGS. 16 à 19 show the following steps of the method in a second variant.

In FIG. 16: after the formation of the nitride mask covered with spacers, which can be seen in FIG. 9, a first etching of the insulating layer 108 to the depth P2 is carried out.

Figure 17:
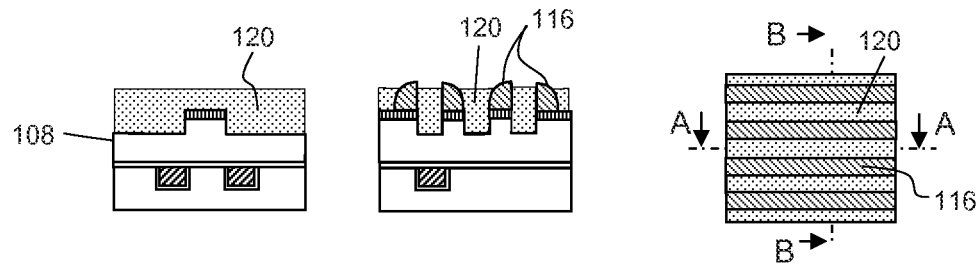

Then, a layer 120 sensitive to an electron beam is deposited with a view to the lithography of the conducting vias (FIG. 17).

Figure 18:
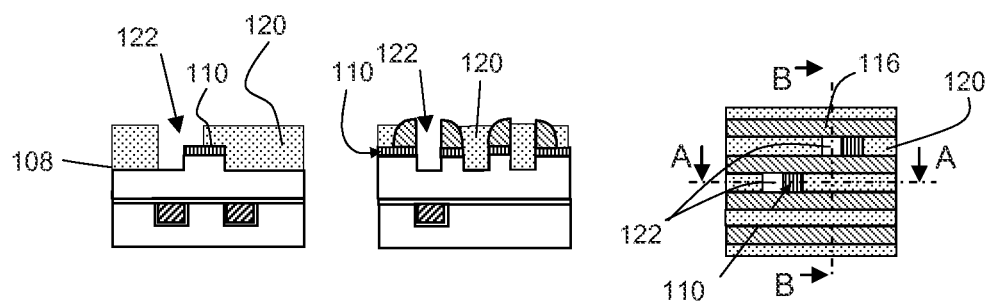

The layer 120 is exposed to an electron beam according to a pattern of openings 122 allowing the vias to be defined, with the same comments that have been made with regard to FIG. 11 relating to the bounding of these openings 122 in the sensitive layer (FIG. 18).

Figure 19:
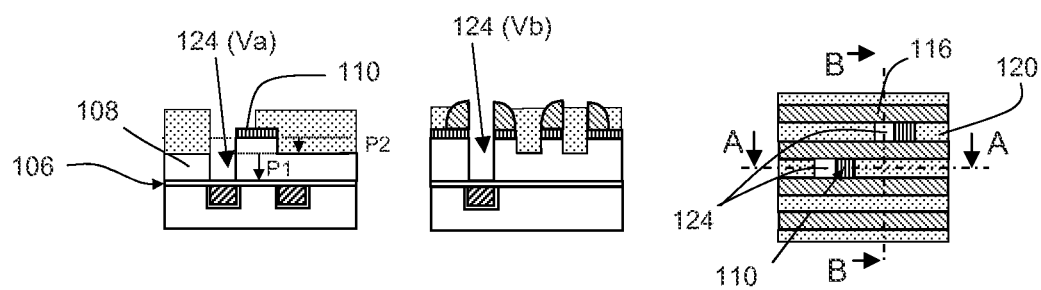

The second etching of the insulating layer 108 is then carried out at the places where it is not protected by the nitride, the sensitive layer or the spacers; the layer is etched down to a depth P1 which, only in the vias 124, is added to the depth P2 (FIG. 19).

The layer 106, potentially present in the bottom of the vias, is eliminated exposing the conductors of the first network at the bottom of the vias. The sensitive layer 120 and the spacers 116 are subsequently eliminated.

Finally, a conductive material, as has been explained with reference to FIG. 15, is deposited by a damascene process, in order to end up with the same structure as in FIG. 15, then the nitride mask 110 is removed.

The invention claimed is:

1. A lithographic method for forming in a substrate two superposed networks of conductors separated by an insulating layer, with conducting vias in the insulating layer for connecting conductors of a first network to conductors of a second network at locations where conductors of the first network cross conductors of the second network, the method comprising:

forming conductors of the first network on the substrate, depositing an insulating material covering the conductors of the first network to form said insulating layer, depositing a mineral mask layer onto the insulating material, depositing a sacrificial layer and etching said sacrificial layer according to a first partial pattern, forming spacers on edges of portions of the etched sacrificial layer, the spacers leaving free regions defining a second partial pattern, removing the etched sacrificial layer to leave only the spacers, etching the mineral mask layer where said mineral mask layer is not protected by the spacers, said etching the mineral mask layer defining locations of the conductors of the second network, etching the insulating material down to a first depth, in a first etching step, etching the insulating material down to a second depth, in a second etching step, one of said first and second etching steps being done according to a pattern defined by the etched mineral mask for defining the locations of the conductors of the second network, and the other of said first and second etching steps being bounded both by openings formed in a masking layer etched by lithography and by the second partial pattern defined by the spacers, the openings defining locations for conducting vias and being bounded on at least two opposing edges by spacers, and filling voids etched into the insulating material with a conductive material flush with a surface of the insulating material without overspilling from said etched voids, said conductive material forming both the conductors of the second network and the conducting vias.

2. The method as claimed in claim 1, wherein said masking layer etched by lithography is deposited prior to the first and second steps of etching the insulating material, said masking layer then exposed according to a pattern of openings, following which the first etching step of the insulating material is carried out for defining locations of said conducting vias, the masking layer etched by lithography is eliminated, and the second etching step is carried out for defining the locations of conductors of the second network.

3. The method as claimed in claim 2, wherein the spacers are eliminated prior to the second etching step.

4. The method as claimed in claim 1, wherein the first etching step of the insulating material is carried out after the etching of the mineral mask for defining locations of the conductors of the second network, then the masking layer etched by lithography is deposited and etched according to a pattern of openings, then the second etching step of the insulating material is carried out for defining the locations of the conducting vias, following which the masking layer etched by lithography and the pacers are eliminated.

5. The method as claimed in claim 1, wherein the masking layer etched by lithography is a photoresist sensitive to ion or electron or photon radiation and its thickness is less than the height of the spacers.

6. The method as claimed in claim 5, wherein the masking layer etched by lithography is composed of a superposition of a non-sensitive layer and of a sensitive layer, the non-sensitive layer having a thickness less than a height of the spacers.

7. The method as claimed in claim 1, wherein the insulating material is a dielectric material with a low dielectric constant deposited onto a silicon wafer.

8. The method as claimed in claim 1, wherein the conductive material is copper.

9. The method as claimed in claim 1, wherein, between the step of removing of the sacrificial layer and the etching of the mineral mask layer, an additional lithography step is provided in order to protect the mineral mask layer in additional regions other than the spacers.

10. The method as claimed in claim 9, wherein the additional lithography step uses a layer sensitive to an electron beam which has a thickness less than or equal to a height of the spacers.

* * * * *